US011042289B2

(12) United States Patent
Nagasaka

(10) Patent No.: US 11,042,289 B2
(45) Date of Patent: Jun. 22, 2021

(54) ELECTRONIC DEVICE, CHARACTER INPUT CONTROL METHOD, AND NON-TRANSITORY STORAGE MEDIUM

(71) Applicant: KYOCERA Corporation, Kyoto (JP)

(72) Inventor: Yushi Nagasaka, Ritto (JP)

(73) Assignee: KYOCERA CORPORATION, Kyoto (JP)

( * ) Notice: Subject to any disclaimer, the term of this patent is extended or adjusted under 35 U.S.C. 154(b) by 0 days.

(21) Appl. No.: 16/088,445

(22) PCT Filed: Mar. 10, 2017

(86) PCT No.: PCT/JP2017/009801
§ 371 (c)(1),
(2) Date: Sep. 26, 2018

(87) PCT Pub. No.: WO2017/169668
PCT Pub. Date: Oct. 5, 2017

(65) Prior Publication Data
US 2019/0087080 A1  Mar. 21, 2019

(30) Foreign Application Priority Data
Mar. 29, 2016  (JP) .............................. JP2016-066387

(51) Int. Cl.
*G06F 3/0488*  (2013.01)
*H03M 11/08*  (2006.01)
(Continued)

(52) U.S. Cl.
CPC ........ *G06F 3/04883* (2013.01); *G06F 3/0236* (2013.01); *G06F 3/04886* (2013.01);
(Continued)

(58) Field of Classification Search
CPC .......... H04M 1/72552; H04M 2250/22; G06F 3/04883
See application file for complete search history.

(56) References Cited

U.S. PATENT DOCUMENTS

| 6,734,881 B1 * | 5/2004 | Will .................... H04M 1/2748 715/811 |
| 2004/0066422 A1 * | 4/2004 | Chandane ........... G06F 3/04886 715/865 |

(Continued)

FOREIGN PATENT DOCUMENTS

| EP | 2485133 A1 | 8/2012 |
| JP | 2003-271294 A | 9/2003 |

(Continued)

OTHER PUBLICATIONS

Kazuki Miura, "SubTalker" reading aloud text by converting the text to audio, [online], Jun. 22, 2012, [searched on Nov. 5, 2020], internet <URL: https://www.itmedia.co.jp/promobile/articles/1206/22/news080.html> and partial translation, 3pp.

*Primary Examiner* — Ariel A Balaoing
(74) *Attorney, Agent, or Firm* — Hauptman Ham, LLP

(57) ABSTRACT

An electronic device according to one aspect includes a touch screen including a first key region to which a plurality of first keys are allocated and a second key region to which a plurality of second keys are allocated; and at least one controller configured to execute character input processing based on operations onto the first key detected in the first key region and the second key detected in the second key region of the touch screen, wherein the first key region is a region extending along a first rim of the touch screen, the plurality of the first keys is arranged along the first rim, the second key region is a region extending along a second rim of the (Continued)

touch screen which is different from the first rim, and the plurality of the second keys is arranged along the second rim.

20 Claims, 18 Drawing Sheets

(51) Int. Cl.
*H03M 11/04* (2006.01)
*G06F 3/023* (2006.01)
*H04M 1/72436* (2021.01)
*H04M 1/72466* (2021.01)
*H04M 1/23* (2006.01)

(52) U.S. Cl.
CPC ............ *H03M 11/04* (2013.01); *H03M 11/08* (2013.01); *H04M 1/72436* (2021.01); *H04M 1/72466* (2021.01); *H04M 1/23* (2013.01); *H04M 2250/22* (2013.01); *H04M 2250/70* (2013.01)

(56) References Cited

U.S. PATENT DOCUMENTS

| | | | |
|---|---|---|---|
| 2012/0206382 A1* | 8/2012 | Kusano | G06F 3/0236 345/173 |
| 2013/0239015 A1* | 9/2013 | Forest | A61F 4/00 715/752 |
| 2015/0033122 A1* | 1/2015 | Park | G06F 3/016 715/702 |
| 2016/0041965 A1* | 2/2016 | Ghassabian | G06F 3/04886 715/261 |
| 2017/0277430 A1* | 9/2017 | Ukai | G06F 3/0482 |
| 2018/0004307 A1* | 1/2018 | Nagasaka | G06F 3/0233 |
| 2018/0136836 A1* | 5/2018 | Nagasaka | G06F 3/04886 |
| 2020/0081551 A1* | 3/2020 | Giragossian | G06F 3/0219 |

FOREIGN PATENT DOCUMENTS

| | | |
|---|---|---|
| JP | 200633425 A | 2/2006 |
| JP | 2006-148536 A | 6/2006 |
| JP | 200999067 A | 5/2009 |
| JP | 2012-113685 A | 6/2012 |
| JP | 20133761 A | 1/2013 |
| JP | 2015-219543 A | 12/2015 |
| JP | 2016115194 A | 6/2016 |
| WO | 2008/086302 A1 | 7/2008 |

* cited by examiner

FIG.6

|   | DISPLAY IMAGE | INPUT CANDIDATE |
|---|---|---|
| 1 | A (KANA) COLUMN | A (KANA) |
| 2 | KA (KANA) COLUMN | KA (KANA) |
| 3 | SA (KANA) COLUMN | SA (KANA) |
| 4 | TA (KANA) COLUMN | TA (KANA) |
| 5 | NA (KANA) COLUMN | NA (KANA) |
| 6 | HA (KANA) COLUMN | HA (KANA) |
| 7 | MA (KANA) COLUMN | MA (KANA) |
| 8 | YA (KANA) COLUMN | YA (KANA) |
| 9 | RA (KANA) COLUMN | RA (KANA) |
| 10 | WA (KANA) COLUMN | WA (KANA) |

FIG.7

| FIRST KEY | A (KANA) COLUMN | KA (KANA) COLUMN | SA (KANA) COLUMN | TA (KANA) COLUMN | NA (KANA) COLUMN | HA (KANA) COLUMN | MA (KANA) COLUMN | YA (KANA) COLUMN | RA (KANA) COLUMN | WA (KANA) COLUMN |
|---|---|---|---|---|---|---|---|---|---|---|
| 1 | A (KANA) | KA (KANA) | SA (KANA) | TA (KANA) | NA (KANA) | HA (KANA) | MA (KANA) | YA (KANA) | RA (KANA) | WA (KANA) |
| 2 | I (KANA) | KI (KANA) | SHI (KANA) | TI (KANA) | NI (KANA) | HI (KANA) | MI (KANA) | YU (KANA) | RI (KANA) | WO (KANA) |
| 3 | U (KANA) | KU (KANA) | SU (KANA) | TSU (KANA) | NU (KANA) | HU (KANA) | MU (KANA) | YO (KANA) | RU (KANA) | N (KANA) |
| 4 | E (KANA) | KE (KANA) | SE (KANA) | TE (KANA) | NE (KANA) | HE (KANA) | ME (KANA) | | RE (KANA) | |
| 5 | O (KANA) | KO (KANA) | SO (KANA) | TO (KANA) | NO (KANA) | HO (KANA) | MO (KANA) | | RO (KANA) | |
| 6 | LINE BREAK | LINE BREAK | LINE BREAK | LINE BREAK | LINE BREAK | LINE BREAK | LINE BREAK | LINE BREAK | LINE BREAK | LINE BREAK |
| 7 | DELETION | DELETION | DELETION | DELETION | DELETION | DELETION | DELETION | DELETION | DELETION | DELETION |
| 8 | ALPHANUMERIC CHARACTER | ALPHANUMERIC CHARACTER | ALPHANUMERIC CHARACTER | ALPHANUMERIC CHARACTER | ALPHANUMERIC CHARACTER | ALPHANUMERIC CHARACTER | ALPHANUMERIC CHARACTER | ALPHANUMERIC CHARACTER | ALPHANUMERIC CHARACTER | ALPHANUMERIC CHARACTER |
| 9 | VOICED SOUND MARK, SEMI-VOICED SOUND MARK, A (KANA, UPPER CASE) ⇔ A (KANA, LOWER CASE) | VOICED SOUND MARK, SEMI-VOICED SOUND MARK, A (KANA, UPPER CASE) ⇔ A (KANA, LOWER CASE) | VOICED SOUND MARK, SEMI-VOICED SOUND MARK, A (KANA, UPPER CASE) ⇔ A (KANA, LOWER CASE) | VOICED SOUND MARK, SEMI-VOICED SOUND MARK, A (KANA, UPPER CASE) ⇔ A (KANA, LOWER CASE) | VOICED SOUND MARK, SEMI-VOICED SOUND MARK, A (KANA, UPPER CASE) ⇔ A (KANA, LOWER CASE) | VOICED SOUND MARK, SEMI-VOICED SOUND MARK, A (KANA, UPPER CASE) ⇔ A (KANA, LOWER CASE) | VOICED SOUND MARK, SEMI-VOICED SOUND MARK, A (KANA, UPPER CASE) ⇔ A (KANA, LOWER CASE) | VOICED SOUND MARK, SEMI-VOICED SOUND MARK, A (KANA, UPPER CASE) ⇔ A (KANA, LOWER CASE) | VOICED SOUND MARK, SEMI-VOICED SOUND MARK, A (KANA, UPPER CASE) ⇔ A (KANA, LOWER CASE) | VOICED SOUND MARK, SEMI-VOICED SOUND MARK, A (KANA, UPPER CASE) ⇔ A (KANA, LOWER CASE) |
| 10 | READ ALOUD | READ ALOUD | READ ALOUD | READ ALOUD | READ ALOUD | READ ALOUD | READ ALOUD | READ ALOUD | READ ALOUD | READ ALOUD |

FIG.8

|    | DISPLAY IMAGE | INPUT CANDIDATE |
|----|---------------|-----------------|
| 1  | abc           | a               |
| 2  | def           | d               |
| 3  | ghi           | g               |
| 4  | jkl           | j               |
| 5  | mno           | m               |
| 6  | pqrs          | p               |
| 7  | tuv           | t               |
| 8  | wxyz          | w               |
| 9  | ./@           | .               |
| 10 | a⇔A           |                 |

FIG.9

| FIRST KEY | abc | def | ghi | jkl | mno | pqrs | tuv | wxyz | ./@ |
|---|---|---|---|---|---|---|---|---|---|
| 1 | a | d | g | j | m | p | t | w | . |
| 2 | b | e | h | k | n | q | u | x | / |
| 3 | c | f | i | l | o | r | v | y | @ |
| 4 | A | D | G | J | M | P | T | Z | |
| 5 | B | E | H | K | N | Q | U | W | |
| 6 | C | F | I | L | O | R | V | X | |
| 7 | | | | | | R | | Y | |
| 8 | | | | | | S | | Z | |
| 9 | | | | | | | | | |
| 10 | | | | | | | | | |

# ELECTRONIC DEVICE, CHARACTER INPUT CONTROL METHOD, AND NON-TRANSITORY STORAGE MEDIUM

CROSS-REFERENCE TO RELATED APPLICATION

This application is a national stage of PCT International Application No. PCT/JP2017/009801 filed in Japan on Mar. 10, 2017, which claims priority Japanese Patent Application No. 2016-066387 filed in Japan on Mar. 29, 2016.

FIELD

The present application relates to an electronic device, a character input control method, and a non-transitory storage medium.

BACKGROUND

Some electronic devices are equipped with touch screens. For example, an electronic device which executes various functions according to operations detected via a touch screen is disclosed.

SUMMARY

In the above electronic device, there is room for improvement in technology of character input by a touch screen.

An electronic device, a character input control method, and a non-transitory storage medium are disclosed.

According to one aspect, there is provided a n electronic device comprising: a touch screen including a first key region to which a plurality of first keys are allocated and a second key region to which a plurality of second keys are allocated; and at least one controller configured to execute character input processing based on operations onto the first key detected in the first key region and the second key detected in the second key region of the touch screen, wherein the first key region is a region extending along a first rim of the touch screen, the plurality of the first keys is arranged along the first rim, the second key region is a region extending along a second rim of the touch screen which is different from the first rim, and the plurality of the second keys is arranged along the second rim.

According to one aspect, there is provided a character input control method executed by an electronic device including a touch screen, the character input control method comprising: setting, on the touch screen, a first key region to which a plurality of first keys are allocated and a second key region to which a plurality of second keys are allocated; and executing character input processing based on operations onto the first key detected in the first key region and the second key detected in the second key region of the touch screen, wherein the first key region is a region extending along a first rim of the touch screen, the plurality of first keys are arranged along the first rim, the second key region is a region extending along a second rim of the touch screen which is different from the first rim, and the plurality of second keys are arranged along the second rim.

According to one aspect, there is provided a non-transitory storage medium that stores a character input program for causing an electronic device including a touch screen to execute: setting, on the touch screen, a first key region to which a plurality of first keys are allocated and a second key region to which a plurality of second keys are allocated; and performing character input processing based on operations onto the first key detected in the first key region and the second key detected in the second key region of the touch screen, wherein the first key region is a region extending along a first rim of the touch screen, the plurality of first keys are arranged along the first rim, the second key region is a region extending along a second rim of the touch screen which is different from the first rim, and the plurality of second keys are arranged along the second rim.

The above and other objects, features, advantages and technical and industrial significance of this application will be better understood by reading the following detailed description of presently preferred embodiments of the application, when considered in connection with the accompanying drawings.

BRIEF DESCRIPTION OF THE DRAWINGS

FIG. 6 is a diagram illustrating an example of first key data.

FIG. 7 is a diagram illustrating an example of second key data.

FIG. 8 is a diagram illustrating an example of the first key data.

FIG. 9 is a diagram illustrating an example of the second key data.

DETAILED DESCRIPTION OF THE PREFERRED EMBODIMENTS

A plurality of embodiments for implementing an electronic device, a character input control method, and a character input program according to the present application will be described in detail with reference to the drawings. As an example of a mobile electronic device, a smartphone will be described below.

Figure 1:
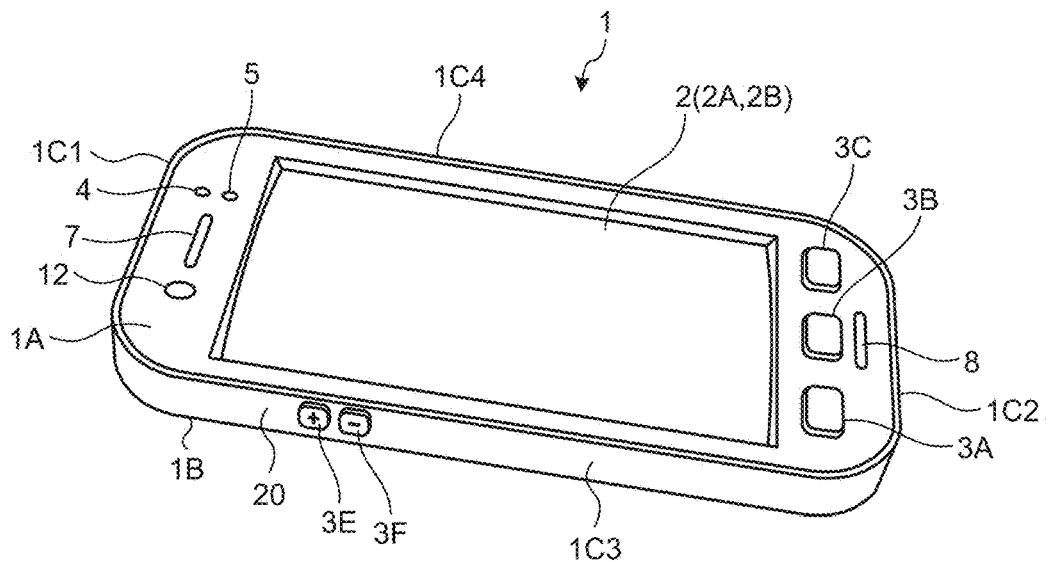
FIG. 1 is a perspective view of a smartphone according to embodiments.
Figure 2:
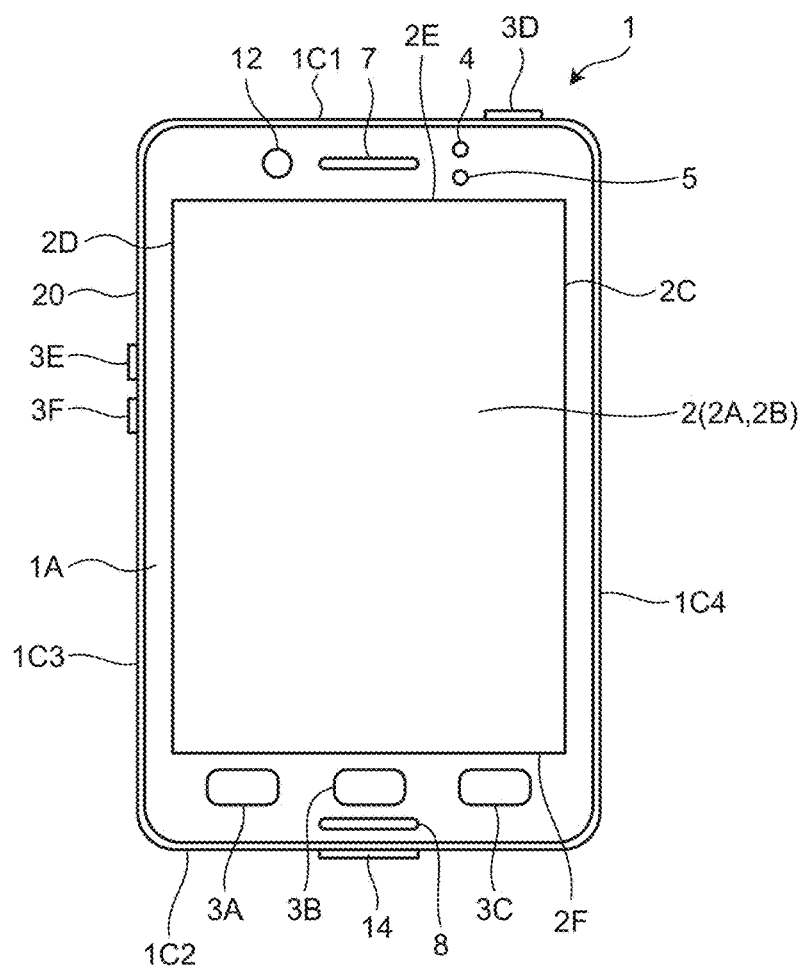
FIG. 2 is a front view of the smartphone.
Figure 3:
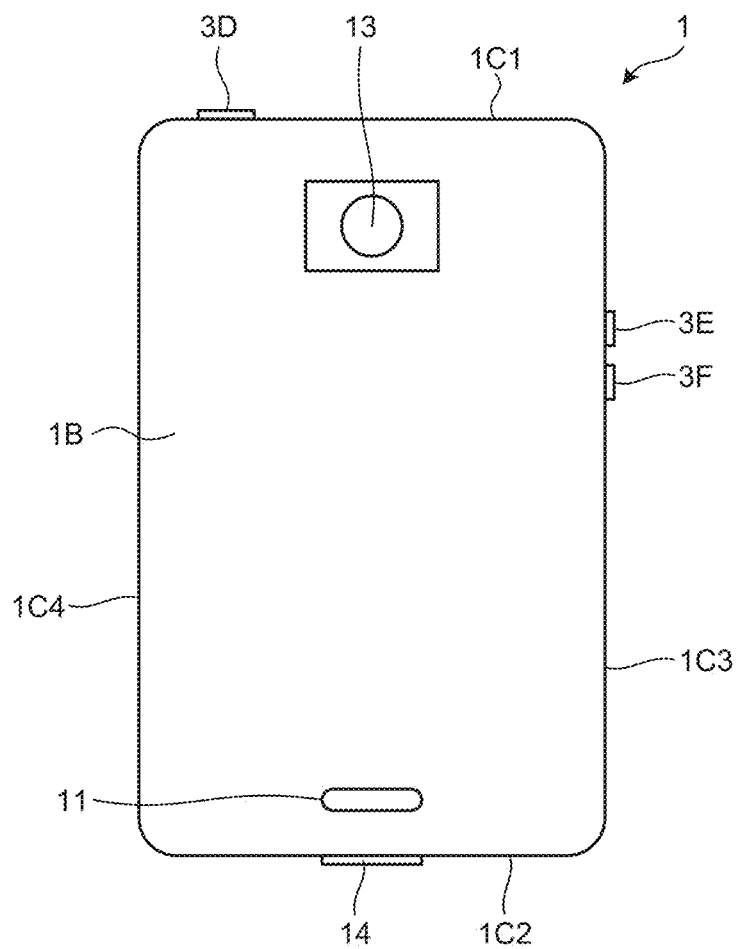
FIG. 3 is a back view of the smartphone.

The overall configuration of a smartphone 1 according to embodiments will be described with reference to FIGS. 1 to 3. As illustrated in FIGS. 1 to 3, the smartphone 1 includes a housing 20. The housing 20 includes a front face 1A, a back face 1B, and side faces 1C1 to 1C4. The front face 1A is a front surface of the housing 20. The back face 1B is a back surface of the housing 20. The side faces 1C1 to 1C4 are side surfaces connecting the front face 1A and the back face 1B. Hereinafter, the side faces 1C1 to 1C4 will be sometimes collectively referred to as side faces 1C without each face being specified.

The smartphone 1 includes, on the front face 1A, a touch screen display 2, buttons (keys) 3A to 3C, an illuminance sensor 4, a proximity sensor 5, a receiver 7, a microphone 8, and a camera 12. The smartphone 1 includes a speaker 11 and a camera 13 on the back face 1B. The smartphone 1 includes buttons 3D to 3F and a connector 14 on the side faces 1C. Hereinafter, the buttons 3A to 3F will be sometimes collectively referred to as buttons 3 without each button being specified.

The touch screen display 2 includes a display 2A and a touch screen 2B. In the example in FIG. 1, the display 2A and the touch screen 2B each have a substantially rectangular shape, but the shapes of the display 2A and the touch screen 2B are not limited thereto. The display 2A and the touch screen 2B each can have any shape such as a regular or a circular shape. In the example in FIG. 1, the display 2A and the touch screen 2B are arranged in an overlapped manner, but the arrangement of the display 2A and the touch screen 2B is not limited thereto. For example, the display 2A and the touch screen 2B may be arranged side by side, or may be arranged at a distance. In the example in FIG. 1, a long side of the display 2A extends along a long side of the touch screen 2B, and a short side of the display 2A extends along a short side of the touch screen 2B. Nevertheless, a way of overlapping the display 2A and the touch screen 2B is not limited thereto. In a case where the display 2A and the touch screen 2B are arranged in an overlapped manner, for example, one or a plurality of sides of the display 2A may extend along none of the sides of the touch screen 2B. The touch screen display 2 has a rectangular shape, and four sides 2C, 2D, 2E, and 2F abut to the respective side faces 1C1 to 1C4 of the housing 20. The side 2C of the touch screen display 2 abuts to the side face 1C4 of the housing 20. The side 2D of the touch screen display 2 abuts to the side face 1C3 of the housing 20.

The display 2A includes a display device such as a liquid crystal display (LCD), an organic electro-luminescence display (OELD), or an inorganic electro-luminescence display (IELD). The display 2A displays characters, images, symbols, and figures.

The touch screen 2B detects contact of a finger, a pen, a stylus pen, or the like with respect to the touch screen 2B. The touch screen 2B can detect positions where a plurality of fingers, pens, stylus pens, or the like has contacted the touch screen 2B. In the following description, a finger, a pen, a stylus pen, or the like which contacts the touch screen 2B will be sometimes referred to as a "contact object" or a "contactant".

A detection method of the touch screen 2B may be an arbitrary method such as an electrostatic capacitance method, a resistance film method, a surface acoustic wave method, and a load detection method. In the following description, for the ease of description, a user is assumed to contact the touch screen 2B using a finger, for operating the smartphone 1.

The smartphone 1 determines a type of gesture based on at least one of contact detected by the touch screen 2B, a position where the contact has been detected, a change in position where the contact has been detected, an interval between detected contacts, and the number of detected contacts. The gesture is an operation performed onto the touch screen 2B. Examples of gestures to be determined by the smartphone 1 include a touch, a long touch, release, swipe, tap, double tap, long tap, drag, flick, pinch in, and pinch out, but the gestures are not limited thereto.

The smartphone 1 performs operations according to these gestures determined via the touch screen 2B. Thus, operability that is instinctive and easy-to-use for the user is realized. An operation to be performed by the smartphone 1 according to the determined gesture sometimes varies depending on a screen displayed on the display 2A. In the following description, for the ease of description, "the touch screen 2B detects contact, and based on the detected contact, the smartphone 1 determines the type of gesture as X" will be sometimes described as "the smartphone 1 detects X", or "a controller detects X".

Figure 4:
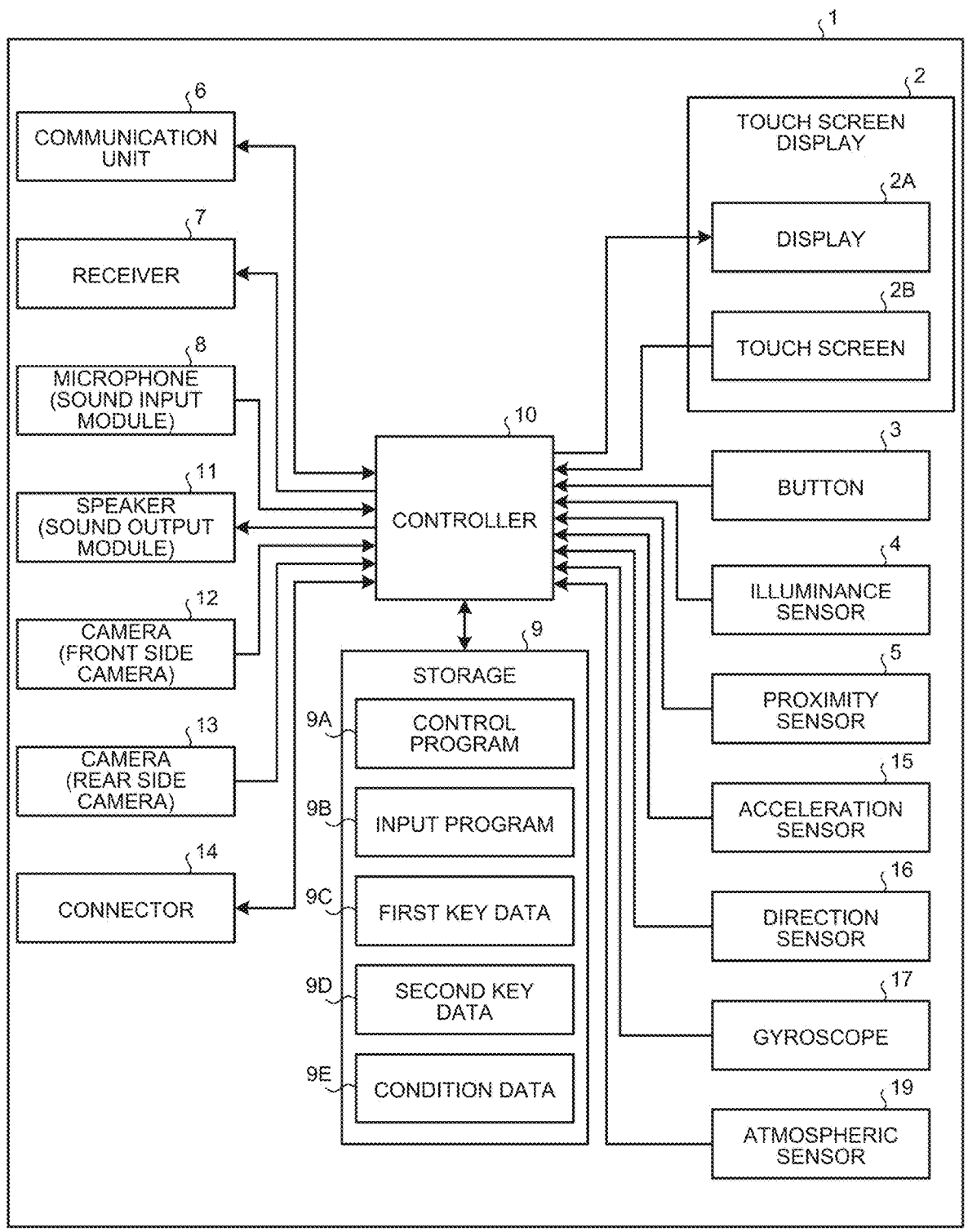
FIG. 4 is a block diagram of the smartphone.

FIG. 4 is a block diagram of the smartphone 1. The smartphone 1 includes the touch screen display 2, the buttons 3, the illuminance sensor 4, the proximity sensor 5, a communication unit 6, the receiver 7, the microphone 8, a storage 9, a controller 10, the speaker 11, the cameras 12 and 13, the connector 14, an acceleration sensor 15, a direction sensor 16, a gyroscope 17, and a atmospheric 19.

As described above, the touch screen display 2 includes the display 2A and the touch screen 2B. The display 2A displays characters, images, symbols, or figures. The touch screen 2B detects contact. The controller 10 detects the gesture performed on the smartphone 1. Specifically, the controller 10 detects an operation (gesture) performed onto the touch screen 2B (the touch screen display 2), by cooperating with the touch screen 2B.

Figure 5:
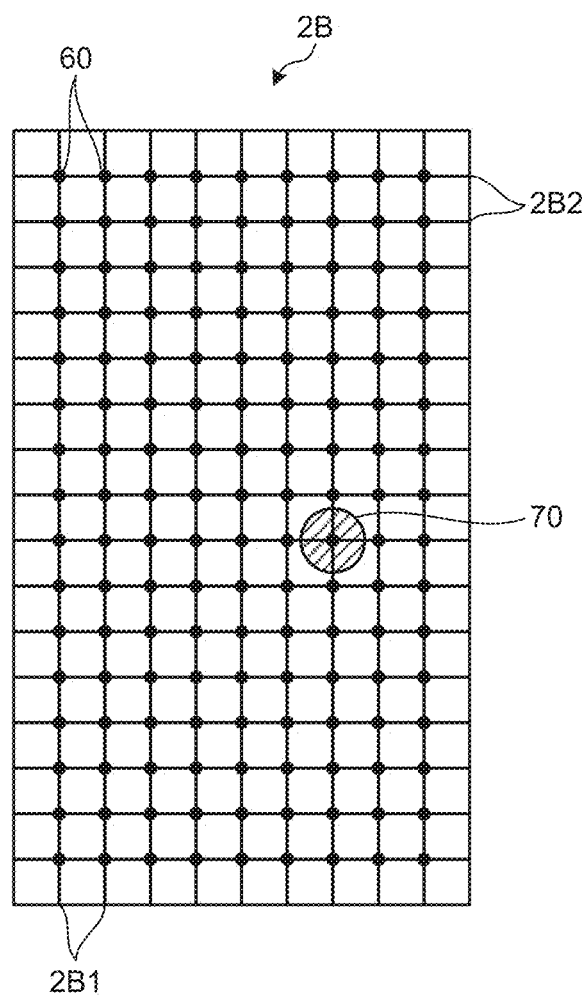
FIG. 5 is a diagram illustrating an example of a detection configuration in a touch screen.

As illustrated in FIG. 5, the touch screen 2B includes a plurality of first electrodes 2B1 and a plurality of second electrodes 2B2. The plurality of first electrodes 2B1 is electrodes extending in a long side direction of the touch screen 2B. The plurality of second electrodes 2B2 is electrodes extending in a short side direction of the touch screen 2B. The plurality of first electrodes 2B1 and the plurality of second electrodes 2B2 intersect with each other in a matrix. A portion at which the first electrode 2B1 and the second electrode 2B2 intersect with each other is a detection point 60 of the touch screen 2B. The touch screen 2B includes a plurality of detection points 60. The plurality of detection points 60 is used in a case where the smartphone 1 identifies a contact position (contact point) of a contactant on the touch screen 2B. The plurality of detection points 60 is positioned in a matrix.

In the touch screen 2B, when a conductive contactant comes close to the first electrode 2B1 and the second electrode 2B2, capacitive coupling is generated between the contactant and the electrodes. On the touch screen 2B, a detection value of the detection point 60 of the electrodes in which capacitive coupling has been generated changes. In the example illustrated in FIG. 5, on the touch screen 2B, the detection values of the detection points 60 near a contact point 70 of the contactant become larger than the detection values of other detection points 60. Thus, the smartphone 1 can detect the contact point 70 of the contactant on the touch screen 2B based on the changed detection values of the detection points 60.

The buttons 3 are operated by the user. The buttons 3 includes the buttons 3A to 3F. The controller 10 detects operations performed on the buttons 3 by cooperating with the buttons 3. Examples of the operations performed on the buttons 3 include click, double click, triple click, push, and multi push, but the operations are not limited theseto.

For example, the buttons 3A to 3C correspond to a home button, a back button, and a menu button. For example, the button 3D corresponds to a power on/off button of the smartphone 1. The button 3D may also serve as a sleep/sleep cancellation button. The buttons 3E and 3F correspond to volume buttons, for example.

The illuminance sensor 4 detects illuminance of surrounding light of the smartphone 1. The illuminance indicates the intensity of light, brightness, or luminance. For example, the illuminance sensor 4 is used for adjustment of the luminance of the display 2A. The proximity sensor 5 detects existence of a neighboring object in a noncontact manner. The proximity sensor 5 detects the existence of the object based on a change in magnetic field, a change in return time of a reflected wave of an ultrasonic wave, or the like. For example, the proximity sensor 5 detects that the touch screen display 2 has been brought close to a face. The illuminance sensor 4 and the proximity sensor 5 may be formed as one sensor. The illuminance sensor 4 may be used as a proximity sensor.

The communication unit 6 wirelessly performs communication. A communication method supported by the communication unit 6 is a wireless communication standard. A wireless communication standard, for example, includes a communication standard of a cellular phone such as 2G, 3G, or 4G. Examples of the communication standard of the cellular phone include, but are not limited to, Long Term Evolution (LTE), Wideband Code Division Multiple Access (W-CDMA), Wideband Code Division Multiple Access 2000 (CDMA2000), Personal Digital Cellular (PDC), a Global System for Mobile Communications (GSM) (registered trademark), a Personal Handy-phone System (PHS), etc. Examples of the wireless communication standard further include, but are not limited to, Worldwide Interoperability for Microwave Access (WiMAX) (registered trademark), IEEE802.11, Bluetooth (registered trademark), Infrared Data Association (IrDA), Near Field Communication (NFC), etc. The communication unit 6 may support one or a plurality of the communication standards described above.

The receiver 7 and the speaker 11 are one example of an output module which outputs sound. The receiver 7 and the speaker 11 can output a sound signal transmitted from the controller 10, as sound. For example, the receiver 7 may be used for outputting voice of a partner on calling. For example, the speaker 11 may be used for outputting ringtone and music. One of the receiver 7 and the speaker 11 may have the function of the other. The microphone 8 is one example of an input module which inputs sound. The microphone 8 can convert voice of the user or the like into a sound signal, and transmit the sound signal to the controller 10.

The storage 9 can store programs and data. The storage 9 may be used as a work area which temporarily stores processing results of the controller 10. The storage 9 includes a recording medium. The recording medium may include an arbitrary non-transitory storage medium such as a semiconductor storage medium and a magnetic storage medium. The storage 9 may include a plurality of types of storage media. The storage 9 may include a combination of a portable storage medium such as a memory card, an optical disc, or a magnetic optical disc, and a reading device of the storage medium. The storage 9 may include a store device used as a temporary storage area such as a Random Access Memory (RAM).

The programs stored in the storage 9 include an application executed in the foreground or background, and a control program which supports the operation of the application. For example, the application causes a screen to be displayed on the display 2A, and causes the controller 10 to execute the processing corresponding to the gesture detected via the touch screen 2B. The control program is an OS, for example. The application and the control program may be installed on the storage 9 by the wireless communication performed by the communication unit 6, or via the non-transitory storage medium.

For example, the storage 9 stores a control program 9A, an input program 9B, first key data 9C, second key data 9D, and condition data 9E.

The control program 9A can provide functions related to various types of control for operating the smartphone 1. For example, the control program 9A implements a phone call by controlling the communication unit 6, the receiver 7, the microphone 8, and the like. The functions provided by the control program 9A include functions of performing various types of control such as changing information displayed on the display 2A, according to the gesture detected via the touch screen 2B. The functions provided by the control program 9A include a function of detecting a movement, a stop, or the like of the user carrying the smartphone 1, by controlling the acceleration sensor 15, the atmospheric sensor 19, and the like. The function provided by the control program 9A may be used in combination with a function provided by another program such as a calculation application and a telephone application.

The input program 9B can provide a function for inputting a text (character) to the smartphone 1. The input program 9B implements character input by displaying a first key in a first key region, and displaying a second key in a second key region. A specific method of character input will be described later. The input program 9B may have a function capable of inputting characters using another input method.

The first key data 9C includes information of the first key to be displayed in the first key region that is set by the input program 9B. The second key data 9D includes information of the second key to be displayed in the second key region that is set by the input program 9B. The second key data 9D is data of a key which is associated with the first key data 9C.

Examples of the first key data 9C and the second key data 9D will be described below using FIGS. 6 and 7. FIG. 6 is a diagram illustrating an example of the first key data. FIG. 7 is a diagram illustrating an example of the second key data. FIGS. 6 and 7 illustrate examples of data used in a case of performing Japanese "kana" input. In the first key data 9C, display images and input candidates are associated with the first keys included in the first key region. For example, a display image "A (kana) column" and an input candidate "A (kana)" are associated with 1 of the first keys. A display image "Ka (kana) column" and an input candidate "Ka (kana)" are associated with 2 of the first keys. The second key data 9D stores correspondence between the first keys and the second keys included in the second key region. Each of a plurality of characters associated as the second keys corresponds to a display image, and one of the plurality of characters corresponds to an input candidate. In the example illustrated in FIG. 7, on the "A (kana) column" of the first keys, "A (kana)" is associated with 1 of the second keys, "I (kana)" is associated with 2 of the second keys, "U (kana)" is associated with 3 of the second keys, "E (kana)" is associated with 4 of the second keys, "O (kana)" is associated with 5 of the second keys, "line break" is associated with 6 of the second keys, and so on. The "A (kana)", "I (kana)", "U (kana)", "E (kana)", and "O (kana)" are examples of the input candidate associated with the display image "A (kana) column". The line break, the deletion, and the like are not characters to be input, but processing to be executed in the character input.

Another examples of the first key data 9C and the second key data 9D will be described below using FIGS. 8 and 9. FIG. 8 is a diagram illustrating an example of the first key data. FIG. 9 is a diagram illustrating an example of the second key data. FIGS. 8 and 9 illustrate examples of data used in a case of performing alphabet input. In the first key data 9C, display images and input candidates are associated with the first keys included in the first key region. For example, a display image "abc" and an input candidate "a" are associated with 1 of the first keys. For example, a display image "def" and an input candidate "d" are associated with 2 of the first keys. The second key data 9D stores correspondence between the first keys and the second keys included in the second key region. Each of a plurality of characters associated as the second keys corresponds to a display image, and one of the plurality of characters corresponds to an input candidate. In the example illustrated in FIG. 9, in the first key "abc", "a" is associated with 1 of the second keys, "b" is associated with 2 of the second keys, "c" is associated with 3 of the second keys, "A" is associated with 4 of the second keys, "B" is associated with 5 of the second keys, and "C" is associated with 6 of the second keys. The "a", "b", "c", "A", "B", and "C" are examples of the input candidates associated with the display image "abc".

An association of keys of the first key data 9C and the second key data 9D and a relationship between display and character input will be described later. In the above embodiments, one character is associated with one key, but a character string of two or more characters including a word, a sentence, and the like may be associated with one key. For example, as an input candidate, "ARIGATOUGO-ZAIMASU (Thank you)" or "ASHITA (Tomorrow)" may be associated with one of the second keys corresponding to the "A (kana) column". A combination of two or more characters that does not make sense may be used.

In the condition data 9E, various types of conditions under which processing is executed in the input program 9B are set. Specifically, in the condition data 9E, a correspondence relationship between the detected touch gesture and the processing to be executed, a start condition of a program, a stop condition of a program, or the like is set.

The controller 10 includes an arithmetic processing unit. The arithmetic processing unit includes a Central Processing Unit (CPU), a System-on-a-chip (SoC), a Micro Control Unit (MCU), a Field-Programmable Gate Array (FPGA), and a coprocessor, for example, but is not limited thereto. The controller 10 can integrally control the operations of the smartphone 1. Various types of functions of the controller 10 are implemented based on the control of the controller 10.

Specifically, the controller 10 can execute a command included in a program stored in the storage 9. The controller 10 can refer to, as necessary, data stored in the storage 9. The controller 10 controls functional modules according to the data and the commands. The controller 10 implements various types of functions by controlling the functional modules. The functional modules include the display 2A, the communication unit 6, the receiver 7, and the speaker 11, for example, but are not limited thereto. The controller 10 sometimes changes the control according to a detection result of a detector. The detector includes the touch screen 2B, the buttons 3, the illuminance sensor 4, the proximity sensor 5, the microphone 8, the camera 12, the camera 13, the acceleration sensor 15, the direction sensor 16, the gyroscope 17, and the atmospheric sensor 19, for example, but is not limited thereto.

By executing the control program 9A or the input program 9B, for example, the controller 10 can execute various types of the control such as changing information displayed on the display 2A, according to the gesture detected via the touch screen 2B.

The camera 12 is a front side camera which images an object facing the front face 1A. The camera 13 is a rear side camera which images an object facing the back face 1B.

The connector 14 is a terminal to which another device is to be connected. The connector 14 may be a general-purpose terminal such as a Universal Serial Bus (USB), a High-Definition Multimedia Interface (HDMI) (registered trademark), Light Peak (Thunderbolt (registered trademark)), and an earphone/microphone connector. The connector 14 may be a dedicated terminal such as a Dock connector. The device to be connected to the connector 14 includes an external storage, a speaker, and a communication device, for example, but is not limited thereto.

The acceleration sensor 15 can detect a direction and magnitude of acceleration acting on the smartphone 1. The direction sensor 16 can detect orientation of geomagnetism. The gyroscope 17 can detect an angle and angular velocity of the smartphone 1. The atmospheric sensor 19 can detect atmospheric pressure acting on the smartphone 1. Detection results of the acceleration sensor 15, the direction sensor 16, the gyroscope 17, and the atmospheric sensor 19 are used in combination for detecting changes in position and attitude of the smartphone 1.

In FIG. 4, part or all of the programs and the data stored in the storage 9 may be downloaded from another device by wireless communication performed by the communication unit 6. In FIG. 4, part or all of the programs and the data stored in the storage 9 may be stored in a non-transitory storage medium readable by a reading device included in the storage 9. In FIG. 4, part or all of the programs and the data stored in the storage 9 may be stored in a non-transitory storage medium readable by a reading device connected to the connector 14. The non-transitory storage medium includes an optical disc such as a CD (registered trademark), a DVD (registered trademark), and a Blu-ray (registered trademark), a magnetic optical disc, a magnetic storage medium, a memory card, and a solid state storage medium, for example, but is not limited thereto.

The configuration of the smartphone 1 illustrated in FIG. 4 is an example, and may be appropriately modified without impairing the scope of the present application. For example, the number and type of the buttons 3 are not limited to the example in FIG. 4. As buttons for the operations related to the screen, the smartphone 1 may include buttons in a numerical keypad arrangement, a QWERTY arrangement, or the like, in place of the buttons 3A to 3C. For the operations related to the screen, the smartphone 1 may include only one button, or needs not include a button. In the example illustrated in FIG. 4, the smartphone 1 includes two cameras, but the smartphone 1 may include only one camera, or needs not include a camera. In the example illustrated in FIG. 4, the smartphone 1 includes four types of the sensors for detecting a position and attitude, but the smartphone 1 needs not include some sensors of these sensors. Alternatively, the smartphone 1 may include another type of sensor for detecting at least one of a position and attitude.

Figure 10:
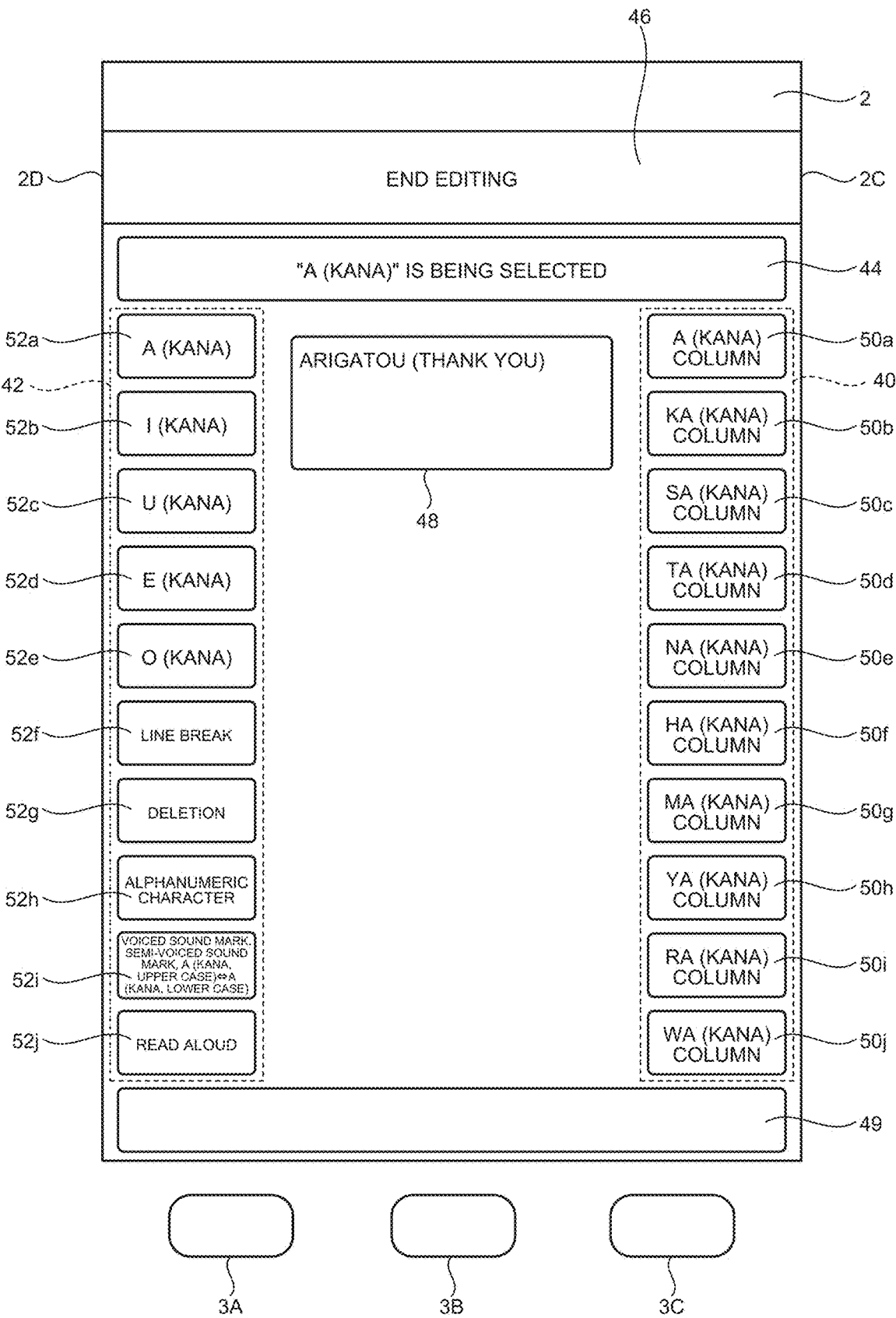
FIG. 10 is a diagram illustrating an example of a display screen.

Then, character input processing performed by the smartphone 1 will be described using FIGS. 10 to 15. FIG. 10 is a diagram illustrating an example of a display screen. In the case of executing character input processing using the input program 9B, the smartphone 1 displays a screen illustrated in FIG. 10. The screen illustrated in FIG. 10 includes a first key region 40, a second key region 42, a notification field 44, an end key 46, a display field 48, and a decision key 49.

The first key region 40 is provided along the side 2C of the touch screen display 2, and abuts to the side 2C. In other words, the first key region 40 abuts to the side face 1C4 of the housing 20. In the first key region 40, a plurality of the first keys 50a, 50b, 50c, 50d, 50e, 50f, 50g, 50h, 50i, and 50j are displayed. The plurality of the first keys 50a, 50b, 50c, 50d, 50e, 50f, 50g, 50h, 50i, and 50j of the present embodiment are arranged in one column from the upper side to the lower side of the screen along the side 2C. Contents of 1 to 10 of the first key data 9C are associated with the respective first keys of the plurality of the first keys 50a, 50b, 50c, 50d, 50e, 50f, 50g, 50h, 50i, and 50j of the present embodiment. Thus, information of 1 of the first key data 9C is associated with the first key 50a, and in the case of "kana" input, an image of the "A (kana) column" is displayed.

The second key region 42 is provided along the side 2D of the touch screen display 2, and abuts to the side 2D. In other words, the second key region 42 abuts to the side face 1C3 of the housing 20. The second key region 42 is arranged on a side different from the first key region 40, and in the present embodiment, is arranged on a side facing the first key region 40. In the second key region 42, a plurality of the second keys 52a, 52b, 52c, 52d, 52e, 52f, 52g, 52h, 52i, and 52j are displayed. The plurality of the second keys 52a, 52b, 52c, 52d, 52e, 52f, 52g, 52h, 52i, and 52j of the present embodiment are arranged in a column from the upper side to the lower side of the screen along the side 2D. Contents of 1 to 10 of the second key data 9D are associated with the respective second keys of the plurality of the second keys 52a, 52b, 52c, 52d, 52e, 52f, 52g, 52h, 52i, and 52j of the present embodiment. Thus, information of 1 of the second key data 9D is associated with the second key 52a, and in the case where "kana" input is to be performed and the "A (kana) column" of the first key 50a is selected, an image of "A (kana)" is displayed.

In the notification field 44, a character being select as an input candidate is displayed. The end key 46 is a key associated with an end operation of text input. The display field 48 is a field in which input characters are displayed. In FIG. 10, an input character string "ARIGATOU (Thank you)" is displayed in the display field 48. The character string in FIG. 10 is an example. The decision key 49 is a key associated with an operation of deciding an input candidate character as a character to be input. The decision key 49 abuts to both of the side 2C and the side 2D. The decision key 49 abuts to both of the first key region 40 and the second key region 42. An arrangement position of the decision key 49 is not limited thereto.

Figure 11:
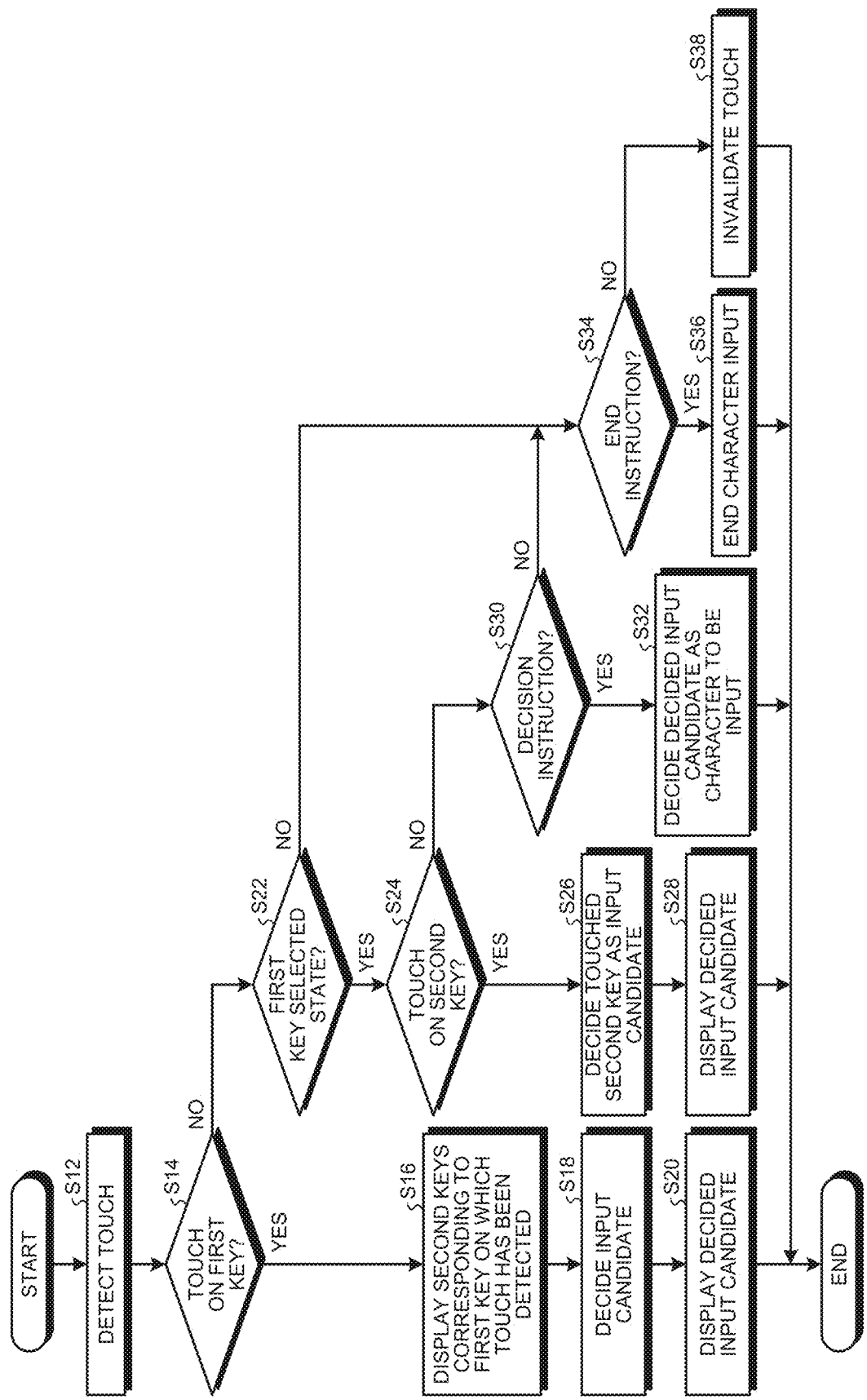
FIG. 11 is a flowchart illustrating a processing procedure of an example of control performed by the smartphone.

Then, a processing procedure of the control related to the character input performed by the smartphone 1 will be described with reference to FIGS. 11 to 15. FIG. 11 is a flowchart illustrating a processing procedure of an example of the control performed by the smartphone 1. FIGS. 12 to 15 are diagrams each illustrating an example of the display screen. The processing procedure illustrated in FIG. 11 is implemented by the controller 10 executing the input program 9B. The processing illustrated in FIG. 11 is processing to be executed in a state where a character input function of the input program 9B is activated.

As illustrated in FIG. 11, the controller 10 of the smartphone 1 detects a touch (Step S12). When the controller 10 has detected a touch, the controller 10 determines whether the detected touch is a touch on the first key (Step S14). When it is determined that the detected touch is a touch on the first key (Yes at Step S14), the controller 10 displays the second keys corresponding to the first key on which the touch has been detected (Step S16). In other words, the controller 10 extracts, from the second key data 9D, data corresponding to the first key on which the touch has been detected, and displays the extracted data in the plurality of respective second keys in the second key region 42. Subsequently, the controller 10 decides an input candidate (Step S18), and displays the decided input candidate (Step S20). Specifically, the controller 10 acquires, from the first key data 9C, information of an input candidate corresponding to the first key on which the touch has been detected, decides the acquired input candidate as an input candidate, and displays the input candidate.

Figure 12:
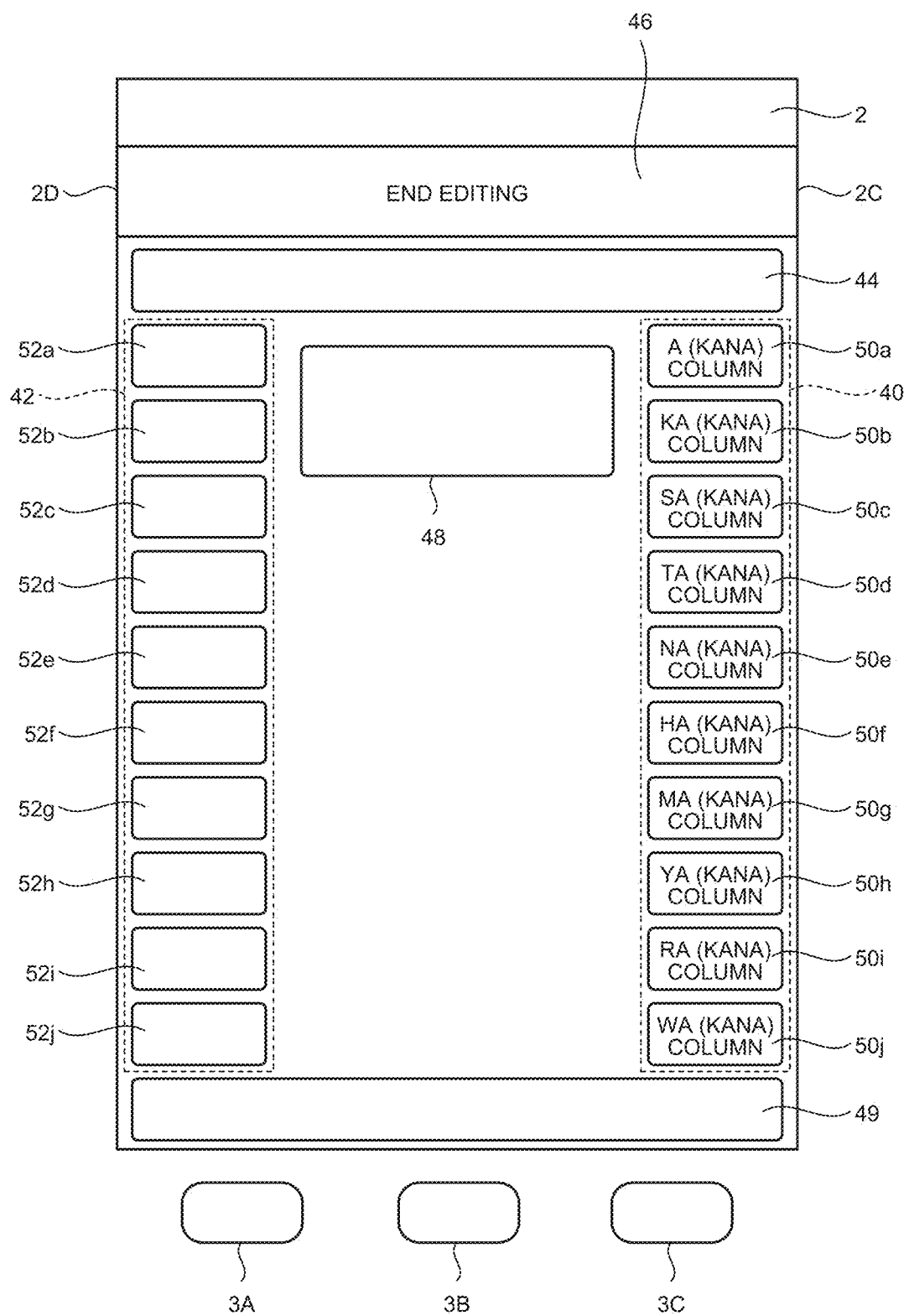
FIG. 12 is a diagram illustrating an example of a display screen.
Figure 13:
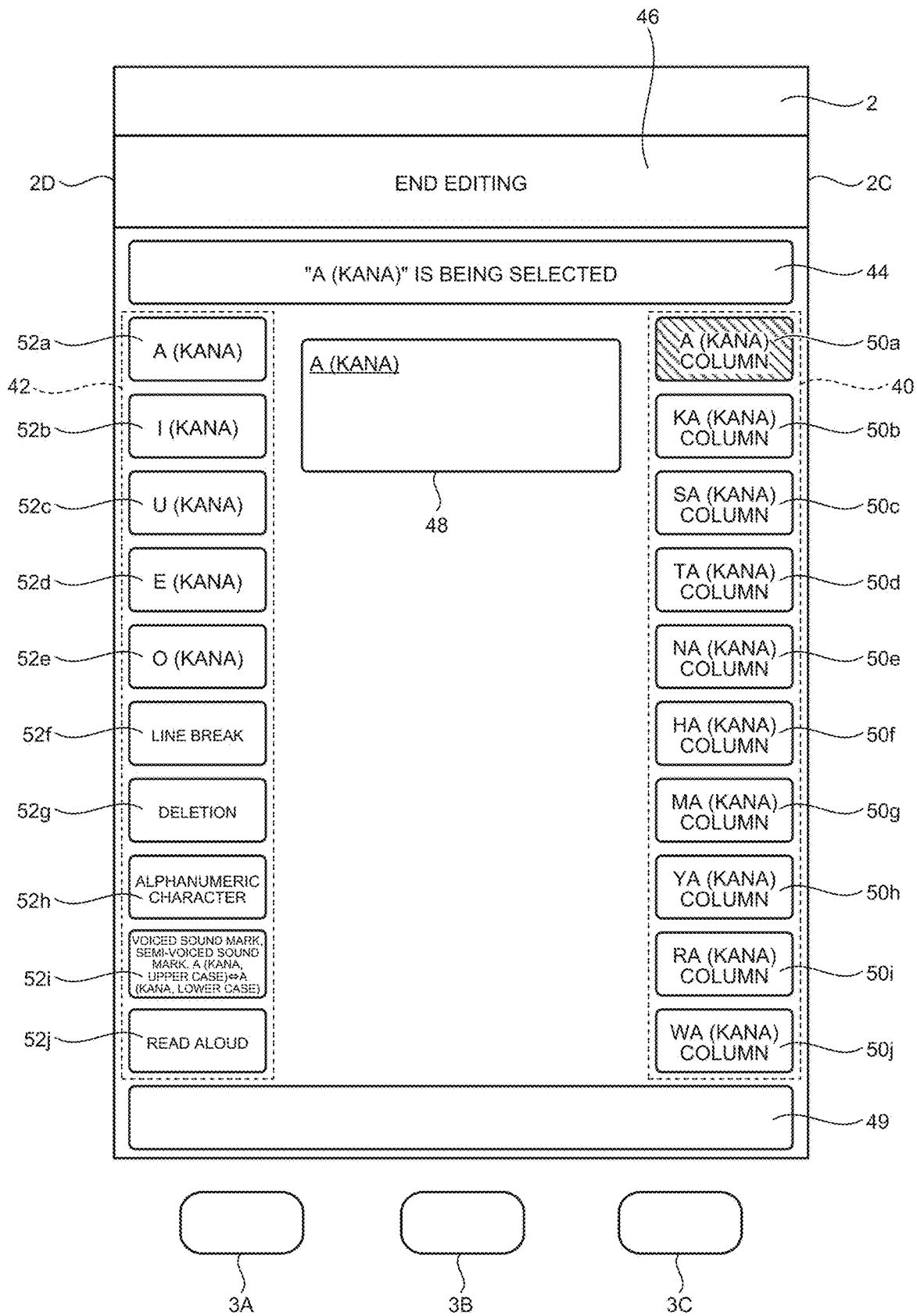
FIG. 13 is a diagram illustrating an example of the display screen.

As an example, when the first key data 9C is not selected, the controller 10 associates information of each of the first key data 9C to the respective first keys 50a to 50j in the first key region 40 on the touch screen display 2 as illustrated in FIG. 12, and displays display images of the respective keys. When the first key is not selected, only outer frame of the second keys 52a to 52j are displayed in the second key region 42, and internal characters are not displayed. For example, when the controller 10 detects a touch on the first key 50a in the state illustrated in FIG. 12 as illustrated in FIG. 13, the controller 10 associates the second keys corresponding to the "A (kana) column" in the second key data 9D to the respective second keys 52a to 52j in the second key region 42. The controller 10 decides "A (kana)" corresponding to the "A (kana) column" of the first key 50a as an input candidate, and displays information of the input candidate character in the notification field 44 as ""A (kana)" is being selected". The controller 10 displays, in the display field 48, "A (kana)" which is the undetermined input candidate character.

Figure 14:
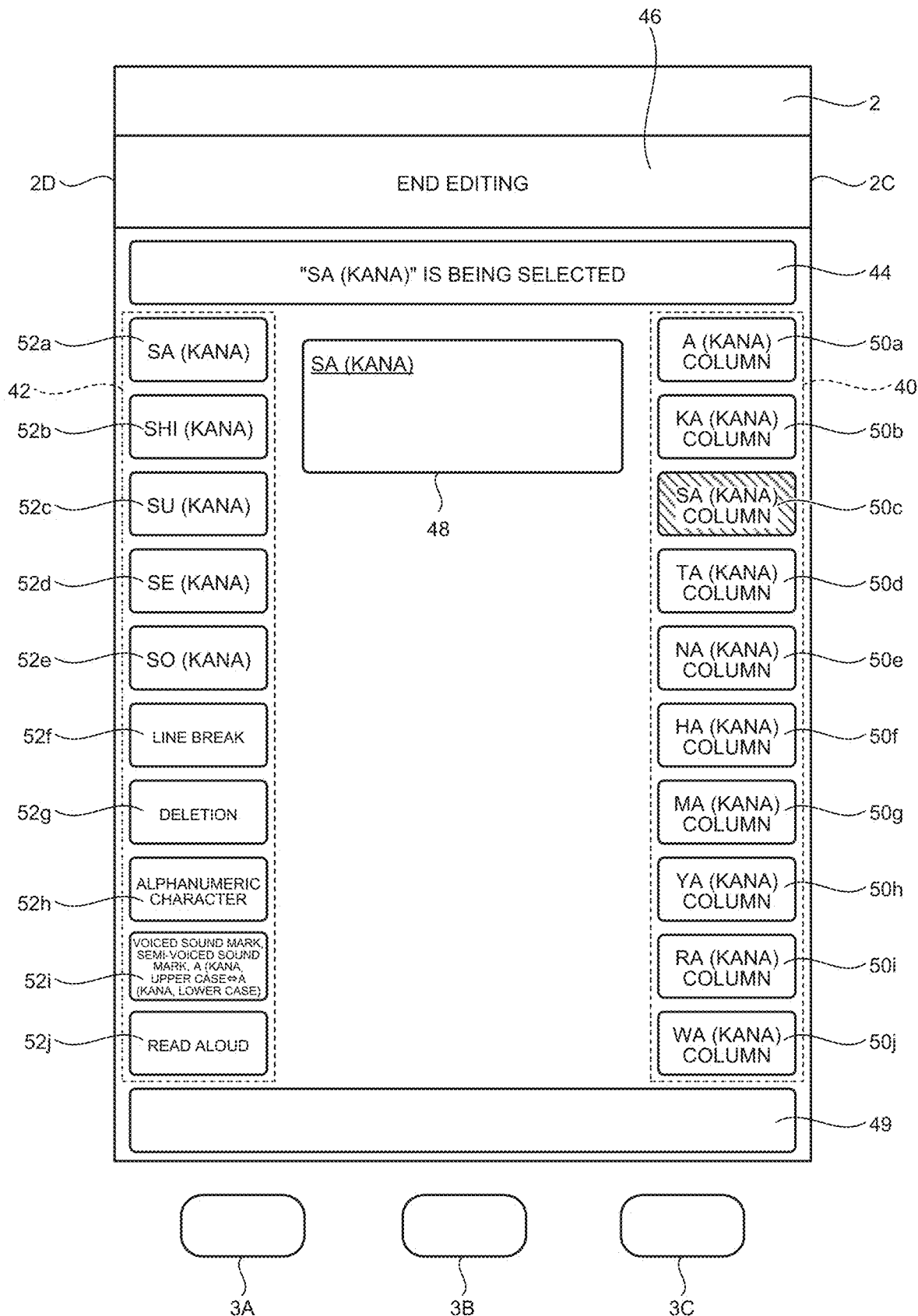
FIG. 14 is a diagram illustrating an example of the display screen.

Also when any of the first keys 50b to 50j which is different from the first key 50a is selected, the controller 10 can execute processing similar to the processing performed when the first key 50a is selected. For example, when the controller 10 detects a touch on the first key 50c in the state illustrated in FIG. 13 as illustrated in FIG. 14, the controller 10 associates the second keys corresponding to the "Sa (kana) column" in the second key data 9D to the respective second keys 52a to 52j in the second key region 42. The controller 10 decides "Sa (kana)" corresponding to the "Sa (kana) column" of the first key 50c as an input candidate, and displays information of the input candidate character in the notification field 44 as ""Sa (kana)" is being selected". The controller 10 displays, in the display field 48, "Sa (kana)" which is the undetermined input candidate character.

When it is determined that the detected touch is not a touch on the first key (No at Step S14), the controller 10 determines whether the current state is a first key selected state (Step S22). In other words, the controller 10 determines whether the current state is a state where any of the first keys 50a to 50j is selected, and second keys corresponding to the selected first key are displayed as the second keys 52a to 52j in the second key region 42.

Figure 15:
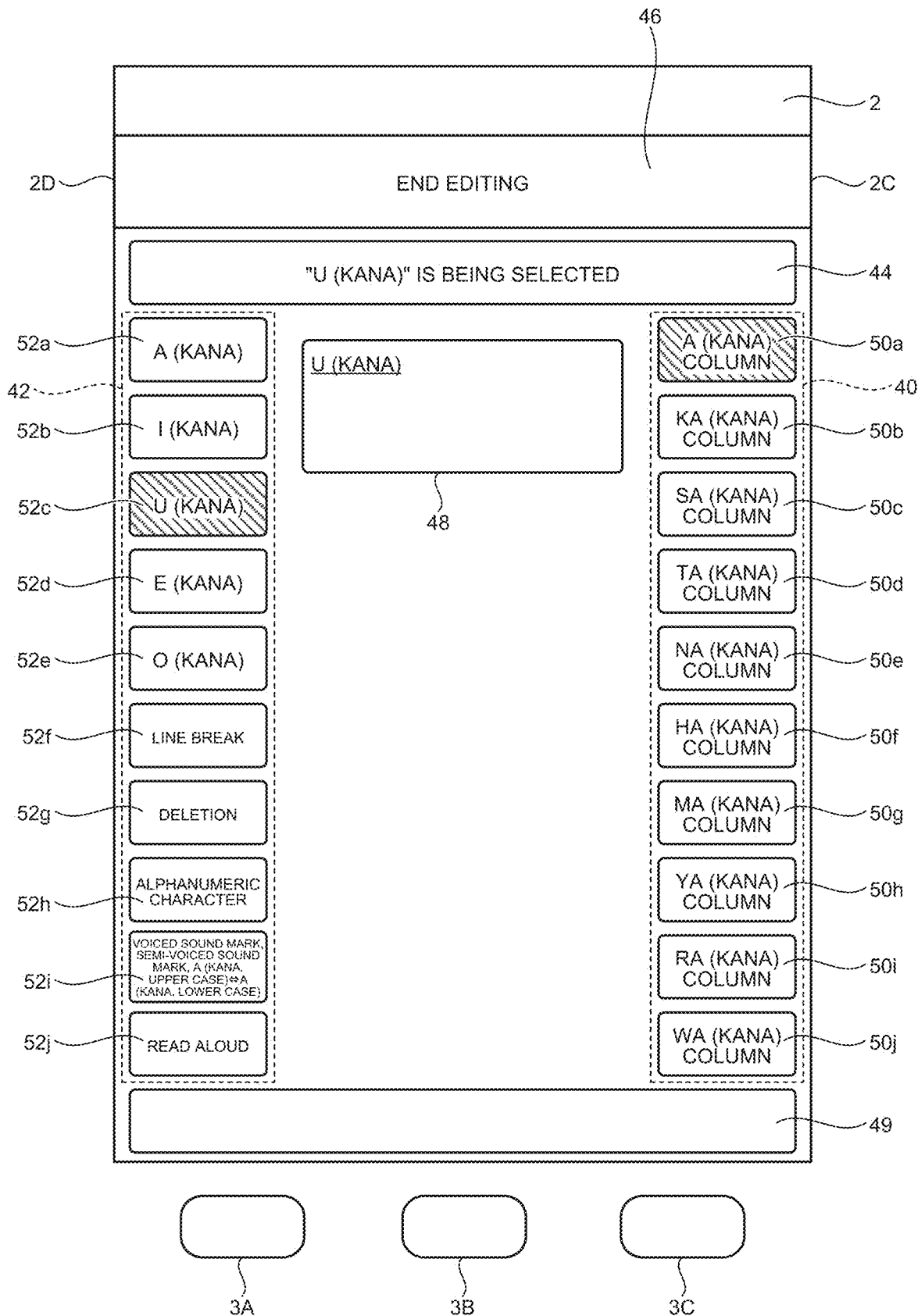
FIG. 15 is a diagram illustrating an example of the display screen.

When it is determined that the current state is the first key selected state (Yes at Step S22), the controller 10 determines whether the detected touch is a touch on the second key (Step S24). When it is determined that the detected touch is the touch on the second key (Yes at Step S24), the controller 10 decides the touched second key as an input candidate (Step S26), and displays the decided input candidate (Step S28). For example, when the controller 10 detects a touch on the second key 52c in the state illustrated in FIG. 13 as illustrated in FIG. 15, the controller 10 decides "U (kana)" of the second key 52c as an input candidate, and displays information of the input candidate character in the notification field 44 as ""U (kana)" is being selected". The controller 10 displays, in the display field 48, "U (kana)" which is the undetermined input candidate character.

When it is determined that the detected touch is not a touch on the second key (No at Step S24), the controller 10 determines whether the detected touch is a decision instruction (Step S30). Specifically, the controller 10 determines whether the detected touch is a touch on the decision key 49. When it is determined that the detected touch is the decision instruction (Yes at Step S30), the controller 10 decides the decided input candidate as a character to be input (Step S32).

When it is determined that the current state is not the first key selected state (No at Step S22) or that the detected touch is not the decision instruction (No at Step S30), the controller 10 determines whether the detected touch is an end instruction (Step S34). In other words, the controller 10 determines whether the detected touch is a touch on the end key 46. When it is determined that the detected touch is the end instruction (Yes at Step S34), the controller 10 ends the character input (Step S36). When it is determined that the detected touch is not the end instruction (No at Step S34), the controller 10 invalidates the detected touch (Step S38).

As described above, by providing the first key region 40 and the second key region 42 respectively along the two sides of the touch screen display 2 (the side faces 1C3 and 1C4 of the housing 20), and arranging the first keys 50a to 50j and the second keys 52a to 52j in a column along the provided sides, the smartphone 1 can change a key to be input, by moving a finger along the sides of the touch screen display 2. Thus, the key arrangement of the smartphone 1 becomes easier to understand as compared with a case where the keys of the characters are two-dimensionally arrayed and displayed on the touch screen display 2, and the input by the keys can be made easier. Thus the input by the keys in the smartphone 1 can be made easier even in a state where the touched region is not checked.

In this manner, by arranging the keys along the sides which correspond to edges of a region with a physically definite position, the user of the smartphone 1 can input characters with high accuracy, even in a state where the user cannot recognize the characters on the screen, such as a case where the user has visual impairments, or in a situation where the user cannot view the screen, for example.

By providing the first key region 40 and the second key region 42, and displaying, in the second key region 42, the second keys corresponding to the first key selected in the first key region 40 in the smartphone 1, roles of the respective regions are made understandable, and input operation are made easy. By linearly arranging the keys in the smartphone 1, an arrangement rule can be made understandable as compared with a case where the keys are arranged in a two-dimensional array, for example.

By providing the first key region 40 and the second key region 42 on the facing two sides in the smartphone 1, a character input operation using both hands can be performed more easily.

In the smartphone 1, marking protrusions may be provided on the housing 20 at positions corresponding to the respective keys in the first key region 40 and the second key region 42. By providing the protrusions, a touching position among the keys can be made recognizable in the smartphone 1 and the input operation is assisted.

In the smartphone 1, a region in which the decision key 49 is arranged becomes a third key region, and the decision key 49 becomes a third key. a decision operation of the input candidate can be made easier in the smartphone 1. An arrangement position of the decision key 49 is not limited thereto, and the decision key 49 may be arranged so as to abut to at least one of the first key region 40 and the second key region 42, and arranged alongside of at least one of the first keys and the second keys. By arranging the decision key 49 alongside of at least one of the first keys and the second keys, the position of the decision key 49 can be made understandable in the smartphone 1.

Figure 16:
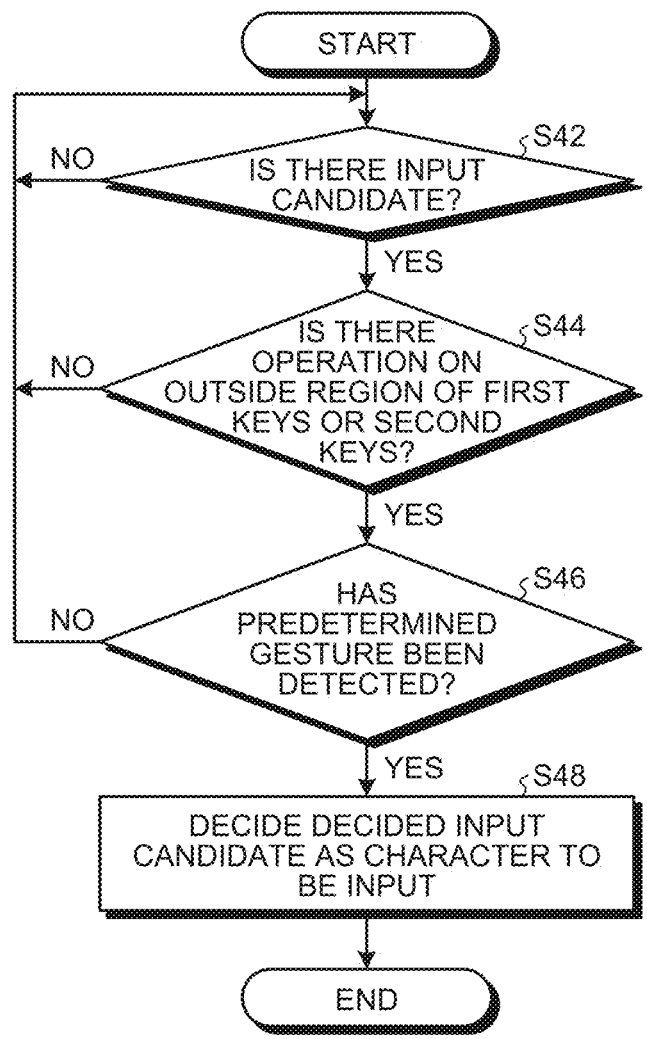
FIG. 16 is a flowchart illustrating the processing procedure of an example of the control performed by the smartphone.

In the above embodiments, the smartphone 1 detects a touch on the decision key 49 as a decision instruction, but, the embodiments are not limited thereto. FIG. 16 is a flowchart illustrating the processing procedure of an example of the control performed by the smartphone 1. The processing illustrated in FIG. 16 can be implemented by the controller 10 processing the input program 9B. The processing illustrated in FIG. 16 can be processed concurrently with the processing illustrated in FIG. 11.

The controller 10 determines whether there is an input candidate (Step S42). When it is determined that there is an input candidate (Yes at Step S42), the controller 10 determines whether there is an operation on an outside region of the first keys or the second keys (Step S44). In other words, the controller 10 determines whether there is an operation on a region other than the first key region 40 and the second key region 42. When it is determined that there is an operation on an outside region of the first keys or the second keys (Yes at Step S44), the controller 10 determines whether a predetermined gesture has been detected (Step S46). The predetermined gesture is a preset operation, and tap, flick, double tap, and the like on a predetermined position are exemplified. As the tap on the predetermined position, a tap on the region other than the first key region 40 and the second key region 42 is exemplified. When it is determined that the predetermined gesture has been detected (Yes at Step S46), the controller 10 decides the decided input candidate as a character to be input (Step S48).

When it is determined that there is no input candidate (No at Step S42), that there is no operation on the outside region of the first keys or the second keys (No at Step S44), or that the predetermined gesture has not been detected (No at Step S46), the controller 10 returns to Step S42, and executes the processing at Step S42 again.

As described above, the smartphone 1 may use a combination of the operation on the outside region of the first keys or the second keys, and the predetermined gesture, as the decision operation. As described above, the smartphone 1 may use either the operation on the outside region of the first keys or the second keys, or the predetermined gesture, as the decision operation.

Figure 17:
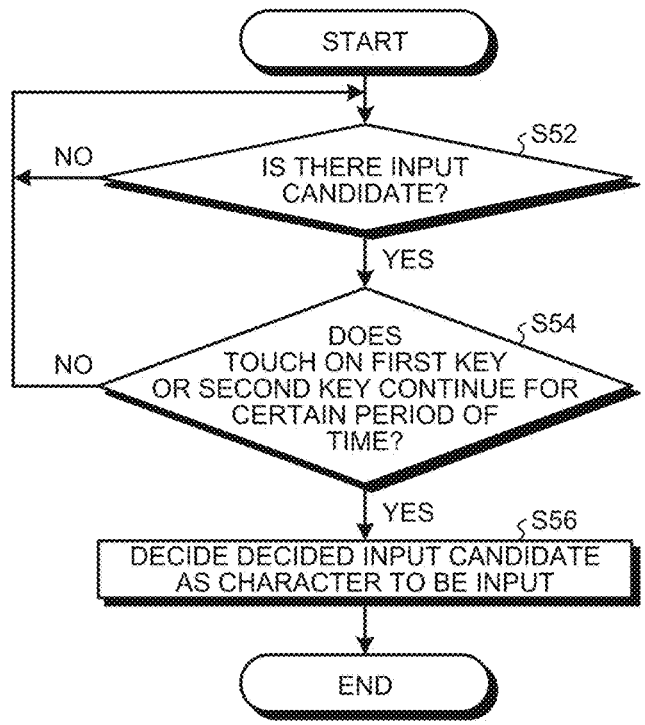
FIG. 17 is a flowchart illustrating the processing procedure of an example of the control performed by the smartphone.

FIG. 17 is a flowchart illustrating the processing procedure of an example of the control performed by the smartphone 1. The processing illustrated in FIG. 17 can be implemented by the controller 10 processing the input program 9B. The processing illustrated in FIG. 17 can be processed concurrently with the processing illustrated in FIG. 11 and the processing illustrated in FIG. 16.

The controller 10 determines whether there is an input candidate (Step S52). When it is determined that there is no input candidate (No at Step S52), the controller 10 returns to Step S52, and executes the processing at Step S52 again. When it is determined that there is an input candidate (Yes at Step S52), the controller 10 determines whether the operation on the first key or the second key continues for a certain period of time (Step S54). In other words, the controller 10 determines whether the operation on a region of the first key region 40 and the second key region 42 is long tap continuing for a certain period of time. When it is determined that the operation on the first key or the second key continues for the certain period of time (Yes at Step S54), the controller 10 decides the decided input candidate as a character to be input (Step S56). When it is determined that the operation on the first key or the second key does not continue for the certain period of time (No at Step S54), the controller 10 returns to Step S52, and executes the processing at Step S52 again. As described above, the smartphone 1 may use long tap on the first key or the second key as the decision operation.

Figure 18:
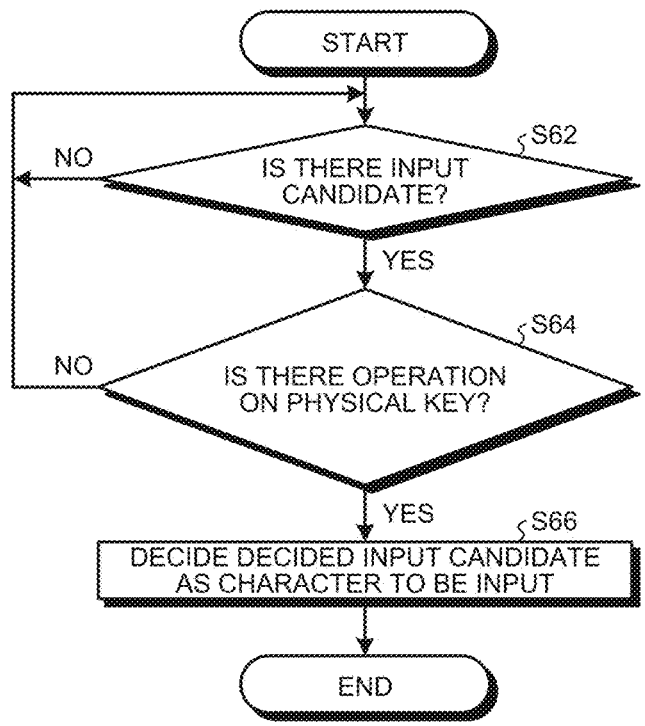
FIG. 18 is a flowchart illustrating the processing procedure of an example of the control performed by the smartphone.

FIG. 18 is a flowchart illustrating the processing procedure of an example of the control performed by the smartphone 1. The processing illustrated in FIG. 18 can be implemented by the controller 10 processing the input program 9B. The processing illustrated in FIG. 18 can be processed concurrently with the processing illustrated in FIG. 11, the processing illustrated in FIG. 16, and the processing illustrated in FIG. 17.

The controller 10 determines whether there is an input candidate (Step S62). When it is determined that there is no input candidate (No at Step S62), the controller 10 returns to Step S62, and executes the processing at Step S62 again. When it is determined that there is an input candidate (Yes at Step S62), the controller 10 determines whether there is the operation on the physical keys (Step S64). In other words, the controller 10 determines whether there is the operation on the buttons 3. When it is determined that there is the operation on the buttons 3 (Yes at Step S64), the controller 10 decides the decided input candidate as a character to be input (Step S66). When it is determined that there is no operation on the buttons 3 (No at Step S64), the controller 10 returns to Step S62, and executes the processing at Step S62 again. As described above, the smartphone 1 may use the operation on the physical keys as the decision operation.

The smartphone 1 may output, as sound, at least one of an input candidate character and an input text. In the present embodiment, the input text is a text (character string) displayed in the display field 48. For example, when a predetermined operation of outputting, as sound, a text input in the state illustrated in FIG. 10 is input, the smartphone 1 may output, as sound, "ARIGATOU (Thank you)" which is the input text. When a predetermined operation of outputting, as sound, an input candidate character input in the state illustrated in FIG. 13 is input, the smartphone 1 may output, as sound, "A (kana)" which is the input text.

Figure 19:
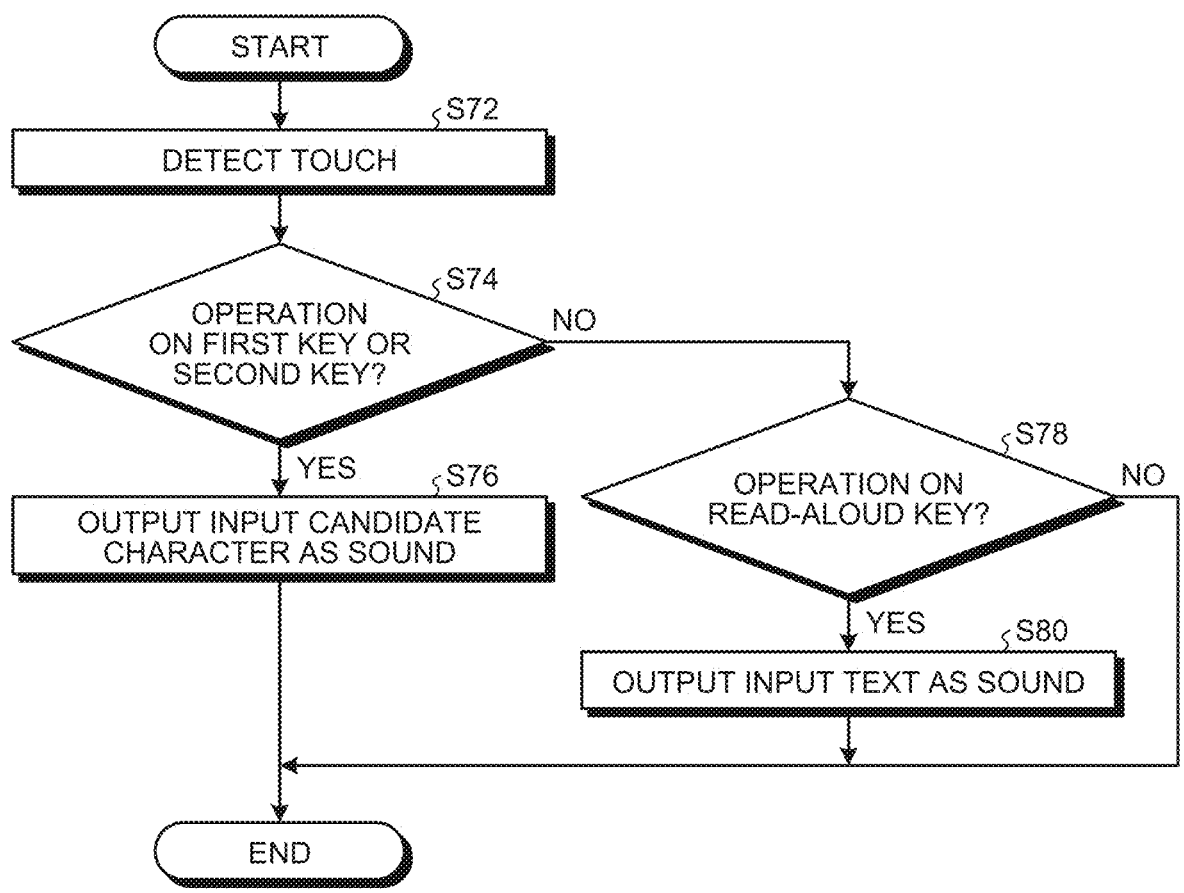
FIG. 19 is a flowchart illustrating the processing procedure of an example of the control performed by the smartphone.

FIG. 19 is a flowchart illustrating the processing procedure of an example of the control performed by the smartphone 1. The processing illustrated in FIG. 19 can be implemented by the controller 10 processing the input program 9B. The processing illustrated in FIG. 19 can be processed concurrently with the processing illustrated in FIG. 11, the processing illustrated in FIG. 16, the processing illustrated in FIG. 17, and the processing illustrated in FIG. 18.

When the controller 10 has detected a touch (Step S72), the controller 10 determines whether the detected touch is an operation on the first key or the second key (Step S74). When it is determined that the detected touch is the operation on the first key or the second key (Yes at Step S74), the controller 10 outputs the input candidate character as sound (Step S76).

When it is determined that that the detected touch is not the operation on the first key or the second key (No at Step S74), the controller 10 determines whether the detected touch is the operation on a read-aloud key (Step S78). When it is determined that the detected touch is the operation on the read-aloud key (Yes at Step S78), the controller 10 outputs the input text as the sound (Step S80). When it is determined that the detected touch is not the operation on the read-aloud key (No at Step S78), the controller 10 ends this processing.

By outputting, as the sound, the input candidate character or the input character string, such as a text (character string) displayed in the display field 48 in the present embodiment, the user of the smartphone 1 can check the character being selected or the input character, even in a situation where the display of the screen cannot be checked. The input candidate character may be output as the sound each time the input candidate character changes. Alternatively, the input candidate character may be output as the sound when a set rule is satisfied, or a set operation is executed.

In the present embodiment, the smartphone 1 displays the images of the first keys and the second keys on the display 2A, but the embodiments are not limited thereto. The smartphone 1 is only required to allocate the inputs of the keys to positions corresponding to the first key region 40 and the second key region 42 described above, and may hide the images. In other words, the smartphone 1 is only required to detect, when the touch screen 2B detects an input in each region, the input as a key input, and the touch screen 2B can associate the first key region 40, the first keys, the second key region 42, and the second keys to the respective regions. Thus, the electronic device may validate character input in a state where the images are not displayed on the display 2A, and the electronic device needs not include the display 2A. When the images are not displayed, the electronic device may execute the sound output when the operation of the key described above is detected.

Embodiments disclosed by the present application can be modified without departing from the scope of the present application. Furthermore, embodiments disclosed by the present application can be appropriately combined. For example, the above embodiments may be modified in the following manner.

For example, the programs illustrated in FIG. 4 may be divided into a plurality of modules, or may be combined with another program.

In the above embodiments, the smartphone 1 has been described as an example of an electronic device including a touch screen, but an electronic device according to the appended claims is not limited to the smartphone. The electronic device according to the appended claims may be a mobile electronic device other than the smartphone. Examples of the mobile electronic device include a mobile phone, a tablet, a mobile personal computer, a digital camera, a SmartWatch, a media player, an electronic book reader, a navigator, and a game machine, but the mobile electronic device is not limited thereto.

Figure 20:
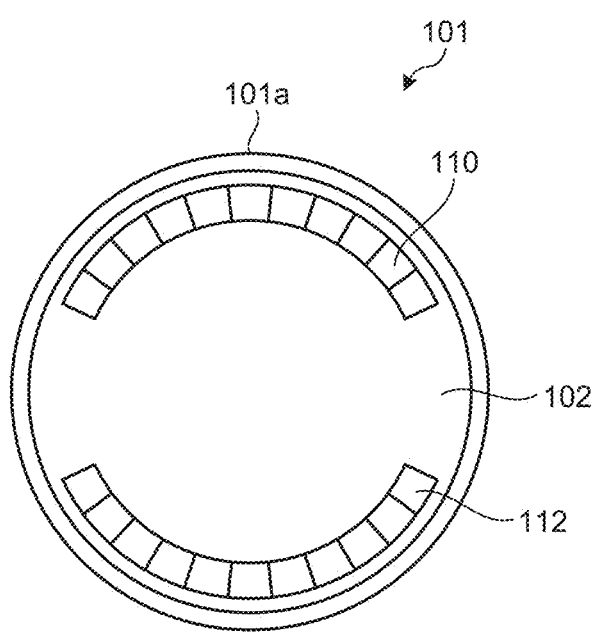
FIG. 20 is a front view of another example of the electronic device.

FIG. 20 is a front view of another example of the electronic device. In the electronic device 101 illustrated in FIG. 20, outer rims of a housing 101a and a touch screen display 102 have a circular shape. In the electronic device 101, a first key region 110 and a second key region 112 are provided at different positions of the outer rims of the housing 101a and the touch screen display 102. In this manner, by providing the first key region 110 and the second key region 112 along the outer rims also in a case where the outer rims of the housing 101a and the touch screen display 102 have a circular shape, keys can be input more easily in a state without checking the touched region. In FIG. 20, a circular shape is provided for the external shape/outer rim of each of the housing 101a and the touch screen display 102 as the electronic device 101 without sides, but the embodiments are not limited thereto. In the electronic device 101, the external shape/outer rim of each of the housing 101a and the touch screen display 102 may be an ellipse. In the electronic device 101, the external shape/outer rim of each of the housing 101a and the touch screen display 102 may be a polygon other than a rectangle, or may be a shape obtained by combining an arc and a straight line.

Although the art of appended claims has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

The invention claimed is:

1. An electronic device, comprising:
    a touch screen including a first key region to which a plurality of first keys is allocated and a second key region to which a plurality of second keys is allocated; and
    at least one controller configured to execute character input processing based on operations onto the plurality of first keys detected in the first key region and the plurality of second keys detected in the second key region of the touch screen,
    wherein the first key region is a region extending along a first rim of the touch screen,
    the plurality of the first keys is arranged along the first rim,
    the second key region is a region extending along a second rim of the touch screen which is different from the first rim,
    the plurality of the second keys is arranged along the second rim,
    the plurality of second keys includes a plurality of character keys and a read-aloud key,
    a decision key arranged along a third rim of the touch screen, and extending continuously from the first rim to the second rim,
    said at least one controller is configured to, in response to detecting contact to one of the plurality of first keys, display a corresponding input candidate character allocated to a character key of the plurality of character keys associated with the one of the plurality of first keys, while displaying and maintaining a position of a character allocated to each of the plurality of first keys,
    said at least one controller is configured to, in response to detecting contact to the decision key, accept the displayed input candidate character as an input character, and
    said at least one controller is configured to, in response to detecting contact to the read-aloud key, output the input character as sound.

2. The electronic device according to claim 1,
    wherein the touch screen includes two or more sides,
    the first key region is a region extending along a first side of the touch screen, and
    the second key region is a region extending along a second side of the touch screen that is different from the first side.

3. The electronic device according to claim 1, further comprising a display that is stacked on the touch screen and configured to display an image,
    wherein the display is configured to display the plurality of the first keys in a region overlapping the first key region and display the plurality of the second keys in a region overlapping the second key region.

4. The electronic device according to claim 1, further comprising a display that is stacked on the touch screen and configured to display an image,
    wherein the display is configured to display the plurality of the first keys in a region overlapping the first key region and display the plurality of the second keys in a region overlapping the second key region,
    each of the plurality of first keys is associated with at least one of the plurality of character keys, and
    the at least one controller is further configured to, in response to detecting contact to a first key of the plurality of first keys, display, in the second key region, at least one character allocated to each character key of the plurality of character keys which is associated with the first key on which the contact has been detected.

5. The electronic device according to claim 1, further comprising a display that is stacked on the touch screen and configured to display an image,
    wherein the display is configured to display the plurality of the first keys in a region overlapping the first key region and display the plurality of the second keys in a region overlapping the second key region,
    each of the plurality of first keys is associated with at least one of the plurality of character keys, and
    the at least one controller is further configured to, in response to detecting contact to a first key of the plurality of first keys, display, in the second key region, at least one character allocated to each character key of the plurality of character keys which is associated with the first key on which the contact has been detected, the at least one character including a character string.

6. The electronic device according to claim 1, further comprising a display that is stacked on the touch screen and configured to display an image,
    wherein the display is configured to display the plurality of the first keys in a region overlapping the first key region and display the plurality of the second keys in a region overlapping the second key region,
    each of the plurality of first keys is associated with at least one of the plurality of character keys, and
    the at least one controller is further configured to, in response to detecting contact to a first key of the plurality of first keys, display, in the second key region, at least one character allocated to each character key of the plurality of character keys associated with the first key on which the contact has been detected, and configured to select the at least one character as the input candidate character.

7. The electronic device according to claim 6, wherein the at least one controller is further configured to, in response to detecting, after detecting the contact to the first key, contact to another first key of the plurality of first keys, change the input candidate character to the at least one character allocated to said each character key of the plurality of character keys associated with the another first key on which the contact has been detected.

8. The electronic device according to claim 4, wherein the at least one controller is further configured to, in response to detecting contact to the character key of the plurality of character keys, select, as the corresponding input candidate character, the at least one character allocated to the character key on which the contact has been detected.

9. The electronic device according to claim 8, wherein the at least one controller is further configured to, in response to detecting contact to another character key after detecting the contact to the character key, change the input candidate character to the at least one character allocated to the another character key on which the contact has been detected.

10. The electronic device according to claim 6,
wherein the display includes a character region in which a character is displayed, and
the at least one controller is further configured to display the input candidate character in the character region of the display.

11. The electronic device according to claim 6, further comprising a physical button on a surface of the electronic device outside the touch screen,
wherein the at least one controller is further configured to, in response to detecting an operation of the physical button in a state where the input candidate character is being displayed, accept the displayed input candidate character as the input character.

12. The electronic device according to claim 6,
wherein the touch screen includes a third key region to which a third key is allocated, and
the third key region is a region extending along at least one of the first rim or the second rim, and the third key is arranged alongside of at least one of the plurality of first keys arranged along the first rim or the plurality of second keys arranged along the second rim along which the third key region extends.

13. The electronic device according to claim 12, wherein the at least one controller is further configured to, in response to detecting contact to the third key, decide the selected input candidate character.

14. The electronic device according to claim 6, wherein the at least one controller is further configured to, in response to detecting a predetermined gesture in a state where the input candidate character is being displayed, accept the displayed input candidate character as the input character.

15. The electronic device according to claim 14, wherein the at least one controller is further configured to, in response to the contact to the first key of the plurality of first keys or to the second key of the plurality of second keys continuing for a predetermined time, detect the contact as the predetermined gesture.

16. The electronic device according to claim 6, wherein the at least one controller is further configured to, in response to detecting a predetermined gesture after detecting contact to an outside of the plurality of first keys or an outside of the plurality of second keys, accept the displayed input candidate character as the input character.

17. The electronic device according to claim 16, wherein the predetermined gesture is a touch on the outside of the plurality of first keys or the outside of the plurality of second keys.

18. A character input control method executed by an electronic device including a touch screen, the character input control method comprising:
setting, on the touch screen, a first key region to which a plurality of first keys is allocated and a second key region to which a plurality of second keys is allocated;
executing character input processing based on operations onto the plurality of first keys detected in the first key region and a plurality of character keys of the plurality of second keys detected in the second key region of the touch screen;
in response to detecting contact to one of the plurality of first keys, causing the touch screen to display a corresponding input candidate character allocated to a character key of the plurality of character keys associated with the one of the plurality of first keys while displaying and maintaining a position of a character allocated to each of the plurality of first keys;
in response to detecting contact to a decision key, accepting the displayed input candidate character as an input character; and
in response to detecting contact to a read-aloud key of the plurality of second keys, outputting the input character as sound,
wherein the first key region is a region extending along a first rim of the touch screen,
the plurality of first keys is arranged along the first rim,
the second key region is a region extending along a second rim of the touch screen which is different from the first rim,
the plurality of second keys is arranged along the second rim, and
the decision key is arranged along a third rim of the touch screen, and extends continuously from the first rim to the second rim.

19. A non-transitory storage medium that stores a character input program for causing an electronic device including a touch screen to execute:
setting, on the touch screen, a first key region to which a plurality of first keys is allocated and a second key region to which a plurality of second keys is allocated;
performing character input processing based on operations onto the plurality of first keys detected in the first key region and a plurality of character keys of the plurality of second keys detected in the second key region of the touch screen; and
in response to detecting contact to one of the plurality of first keys, causing the touch screen to display a corresponding input candidate character allocated to a character key of the plurality of character keys associated with the one of the plurality of first keys while displaying and maintaining a position of a character allocated to each of the plurality of first keys;
in response to detecting contact to a decision key, accepting the displayed input candidate character as an input character; and
in response to detecting contact to a read-aloud key of the plurality of second keys, outputting the input character as sound,
wherein the first key region is a region extending along a first rim of the touch screen,
the plurality of first keys is arranged along the first rim,
the second key region is a region extending along a second rim of the touch screen which is different from the first rim,
the plurality of second keys is arranged along the second rim, and the decision key is arranged along a third rim of the touch screen, and extends continuously from the first rim to the second rim.

20. The electronic device according to claim 1, wherein said at least one controller is configured to, in response to detecting contact to said one of the plurality of first keys or to one of the plurality of character keys associated with the one of the plurality of first keys, display said corresponding input candidate character and output the input candidate character as sound, while displaying and maintaining a position of a character allocated to each of the plurality of first keys.

* * * * *